United States Patent
Switzer et al.

(10) Patent No.: US 11,906,329 B2
(45) Date of Patent: Feb. 20, 2024

(54) TESTING APPARATUS FOR ELECTRONIC OR ELECTRO-MECHANICAL FEEDBACK DEVICES

(71) Applicant: Octava Engineering, LLC, Warren, MI (US)

(72) Inventors: Clint Switzer, Warren, MI (US); Nishant Pathak, Warren, MI (US)

(73) Assignee: Octava Engineering, LLC, Warren, MI (US)

( * ) Notice: Subject to any disclaimer, the term of this patent is extended or adjusted under 35 U.S.C. 154(b) by 0 days.

(21) Appl. No.: 17/575,892

(22) Filed: Jan. 14, 2022

(65) Prior Publication Data

US 2022/0228891 A1 Jul. 21, 2022

Related U.S. Application Data

(60) Provisional application No. 63/172,906, filed on Apr. 9, 2021, provisional application No. 63/138,616, filed on Jan. 18, 2021.

(51) Int. Cl.
*G01D 18/00* (2006.01)
*G01D 5/12* (2006.01)
*G01R 19/165* (2006.01)

(52) U.S. Cl.
CPC ............ *G01D 18/00* (2013.01); *G01D 5/12* (2013.01); *G01R 19/1659* (2013.01)

(58) Field of Classification Search
CPC ...... G01D 18/00; G01D 5/12; G01D 5/24466; G01R 19/1659; G01R 31/2829; G01R 1/00; G01R 3/00; G01R 5/00; G01R 7/00; G01R 9/00; G01R 11/00; G01R 13/00; G01R 15/00; G01R 17/00; G01R 19/00; G01R 21/00; G01R 22/00; G01R 23/00; G01R 25/00; G01R 27/00; G01R 29/00; G01R 31/00; G01R 33/00; G01R 35/00

See application file for complete search history.

(56) References Cited

U.S. PATENT DOCUMENTS

| | | | |
|---|---|---|---|
| 5,436,927 A * | 7/1995 | Brady | G01R 23/005 327/40 |
| 7,005,812 B2 | 2/2006 | Mitchell | |
| 7,462,999 B2 | 12/2008 | Mitchell et al. | |
| 8,356,207 B2 | 1/2013 | Hosek et al. | |
| 2007/0229018 A1* | 10/2007 | Mitchell | G01R 31/343 318/650 |
| 2014/0201571 A1* | 7/2014 | Hosek | G06F 11/2257 714/26 |
| 2019/0058931 A1* | 2/2019 | Burkhardt | H04Q 9/14 |
| 2019/0283409 A1* | 9/2019 | Ikegami | B41J 2/04555 |

* cited by examiner

*Primary Examiner* — Feba Pothen
*Assistant Examiner* — Brent J Andrews
(74) *Attorney, Agent, or Firm* — Fishman Stewart PLLC

(57) ABSTRACT

A testing apparatus and method for detecting faults in encoders are disclosed. The testing apparatus includes a signal conditioning circuit board that receives an encoder signal and a central processing unit in communication with the circuit board and configured to: check for faulty amplitude, check for signal symmetry, check for signal offset, and/or check for signal transmission rate. The testing apparatus includes a real-time controller for real-time signal processing and fault detection.

18 Claims, 11 Drawing Sheets

TESTING APPARATUS FOR ELECTRONIC OR ELECTRO-MECHANICAL FEEDBACK DEVICES

CROSS-REFERENCE TO RELATED APPLICATIONS

This application claims priority to and the benefit of U.S. Provisional Patent Application Ser. No. 63/138,616, Filed on Jan. 18, 2021, and U.S. Provisional Patent Application Ser. No. 63/172,906, Filed on Apr. 9, 2021, the contents of each of which are hereby incorporated by reference in their entirety.

TECHNICAL FIELD

The present disclosure relates generally to a testing apparatus for electronic or electro-mechanical feedback devices, and more particularly to a testing apparatus and method for detecting faults in encoders.

BACKGROUND

Electric motors and servomotors are finding an increasing number of applications in various fields, including automotive electric motors and brushless servomotors. In motor systems for controlling a motor based on the position of the rotor of the motor, a feedback device (e.g., hall sensor or encoder) is used to determine distance (e.g., angular rotation or pulse count), speed and direction. Feedback devices typically provide this information in the form of resistance, voltage, frequency or amperage. However, feedback devices such as encoders are sensitive to many types of faults such as loss of position information, position disturbance (e.g., by noise), and/or frequency variation (e.g., due to vibrations). Conventional testing apparatuses do not sufficiently address faults or errors occurring in the feedback device. Thus, there is a need for an improved testing apparatus for detecting faults and errors in electronic or electro-mechanical feedback devices with improved diagnostic capability such as by viewing individual waveforms for deeper analysis and real-time signal processing.

BRIEF DESCRIPTION OF THE DRAWINGS

While the claims are not limited to a specific illustration, an appreciation of the various aspects is best gained through a discussion of various examples thereof. Although the drawings represent illustrations, the drawings are not necessarily to scale and certain features may be exaggerated to better illustrate and explain an innovative aspect of an example. Further, the exemplary illustrations described herein are not intended to be exhaustive or otherwise limiting or restricted to the precise form and configuration shown in the drawings and disclosed in the following detailed description. Exemplary illustrates are described in detail by referring to the drawings as follows:

DETAILED DESCRIPTION

Figure 1:
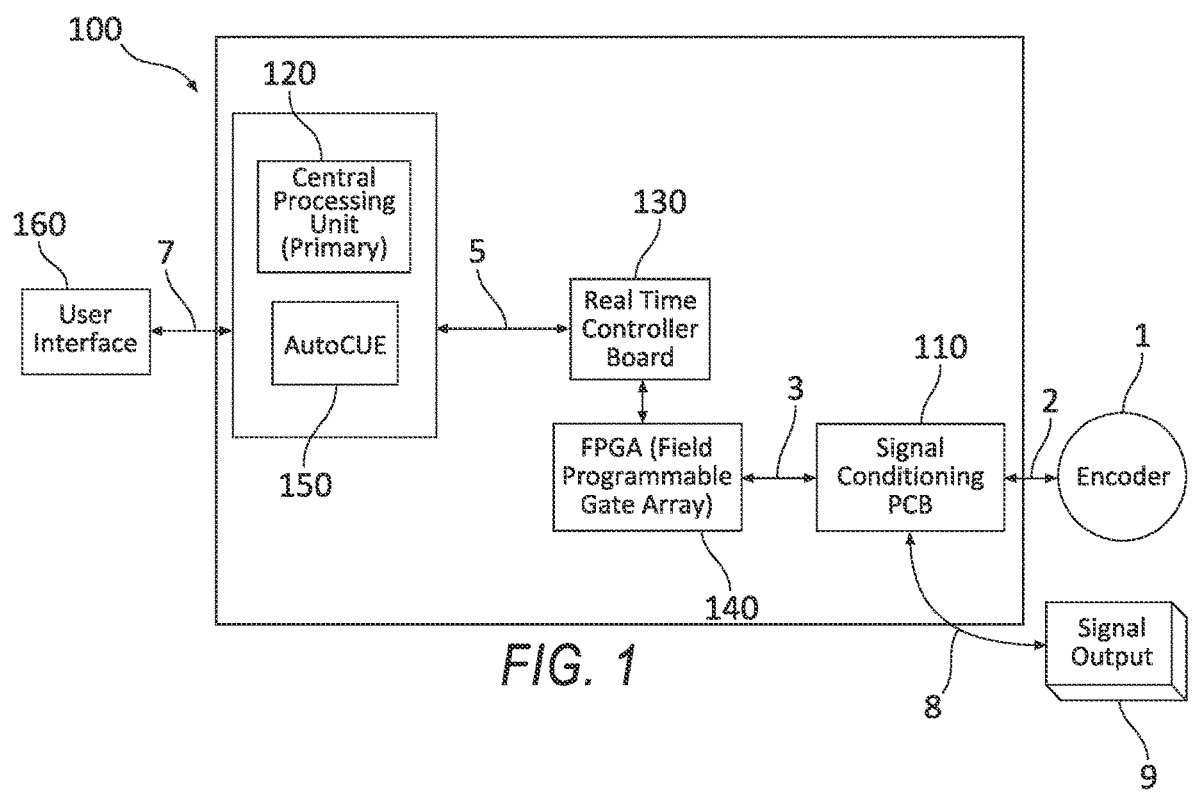
FIG. 1 illustrates a block diagram of a testing apparatus according to an example where the system controller or central processing unit is embedded in the apparatus.

In the drawings, where like numerals and characters indicate like or corresponding parts throughout the several views, exemplary illustrates are shown in detail. The various features of the exemplary approaches illustrated and described with reference to any one of the figures may be combined with features illustrated in one or more other figures, as it will be understood that alternative illustrations that may not be explicitly illustrated or described may be able to be produced. The combinations of features illustrated provide representative approaches for typical applications. However, various combinations and modifications of the features consistent with the teachings of the present disclosure may be desired for particular applications or implementations.

Referring to the drawings, wherein like features and/or functions have like or similar reference numerals, a testing apparatus 100 is show for testing, controlling, analyzing, and/or monitoring electronic or electro-mechanical feedback devices, such as an encoder 1. The testing apparatus 100 may operate as a universal encoder tester that controls, monitors, and analyzes various signals to or from feedback devices such as speed feedback devices, direction feedback devices, angle feedback devices, position feedback devices, power feedback devices, pressure feedback devices and force feedback devices. The testing apparatus 100 helps a user discern faults with improved diagnostic capability by viewing individual waveforms of feedback signals for deeper analysis. Real-time signal processing allows an analysis of waveform symmetry, height, frequency and strength in real-time for both analog and digital signals. By operating in real-time, the testing apparatus 100 is able to detect anomalies plus signal variations, deviations, and symmetry issues.

The testing apparatus 100 includes a signal conditioning circuit board (PCB) 110 that provides the feedback sensor or encoder 1 with power as well as provides signal protection and prepares (e.g., conditions) the signal for outputting or processing. The testing apparatus 100 accepts various types of signals indicative of resistance, voltage, frequency or amperage of the feedback device 1. For example, signals accepted by the testing apparatus 100 include, but are not limited to, analog signals ranging between −10 and +10 volts, analog signals ranging between 0 and 200 milliamperes, digital transistor-transistor-logic (TTL) signals (e.g., square wave) ranging between 0 and 5 volts, serial signals ranging between 0 and 5 volts, and root mean square (RMS) signals ranging between −1000 and +1000 volts.

A central processing unit (CPU) 120 analyzes data and signals communicated by the encoder 1, such as by comparing measured values to predefined values stored in a memory or database, in particular a program or software application (APP) 150 stored in memory of the CPU 120.

The software application (APP) 150 stores predefined thresholds or values of various testing parameters as discussed in more detail below. The predefined values may be encoder and/or manufacture specific, and may be maintained in a database accessible by the CPU 120 for comparing with measured values. For example, encoders operate a specific voltages and amperages, which are stored as parameters associated with particular encoders in the software application 150. The predefined values (e.g., test baseline values) are then compared to measured signals/values during operation to verify and validate whether or not the signal is in proper operating condition, or determine if there is an anomaly/fault if a deviation is detected, as discussed below.

A real-time controller (RTC) 130 transfers signals and data at real-time between the CPU 120 and a field programmable gate array (FPGA) 140, to facilitate instantaneous or near-instantaneous processing and analytics of the signal(s) from the encoder 1.

The FPGA 140 captures signals and formats the signals for the CPU 120. Pursuant to an implementation, the FPGA 140 performs a first pass by collecting values from the encoder 1, and outputs the values to the CPU 120 for analytics. Pursuant to another implementation, the FPGA 140 may be programed to perform analytics on the collected values, such as by comparing measured valves to predefined values to determine fault or error conditions. The FPGA 140 may be configured to check for signal values and/or characteristics separately or in tandem with the CPU 120, and compare the signals to a predefined threshold or value stored in a database, e.g., in the APP 150.

A user interface (UI) 160 provides an operator with control functions as well as a visual notification of what is occurring during operation. The user interface 160 may be separate (external) from and operatively connected to the testing apparatus 100, e.g., via a link or connection line 7, as shown in FIG. 1. Alternatively, the user interface 160 may be integrated into the testing apparatus 100. The user interface 160 may include a display and control buttons for receiving user inputs. The user interface 160 may display counter values (e.g., pulse count displays that display the singleturn value, multiturn value and revolution value), angle values (e.g., mechanical and/or electrical position displays based on signal degrees that tell angular position of the device), speed values (e.g., rotation speed display scaled to revolutions per minute [RPM] based on the revolution counter), revolutions (e.g., number of turns of the encoder disc), and/or absolute position value. The user interface 160 may also display quick report phrases that communicate to the user satisfactory conditions (e.g., received amplitude indicates a health encoder), issues detected (e.g., pulse width falls under acceptable range), and/or corrective actions The drawings additionally show a feedback sensor, e.g., an encoder 1, an input/output connector 2 for a connection cable from the encoder 1 to the testing apparatus 1, communication 3 between the FPGA 140 and the PCB 110, communication 4 between FPGA 140 and RTC 130, communication 5 between CPU 120 and RTC 130, the box 6 indicates APP 150 stored on CPU 120 together with an input/output (I/O) interface, communication 7 between UI 160 and CPU 120, a cable 9 to external device, and signal(s) 9 being outputted from the testing apparatus 1.

Figure 2:
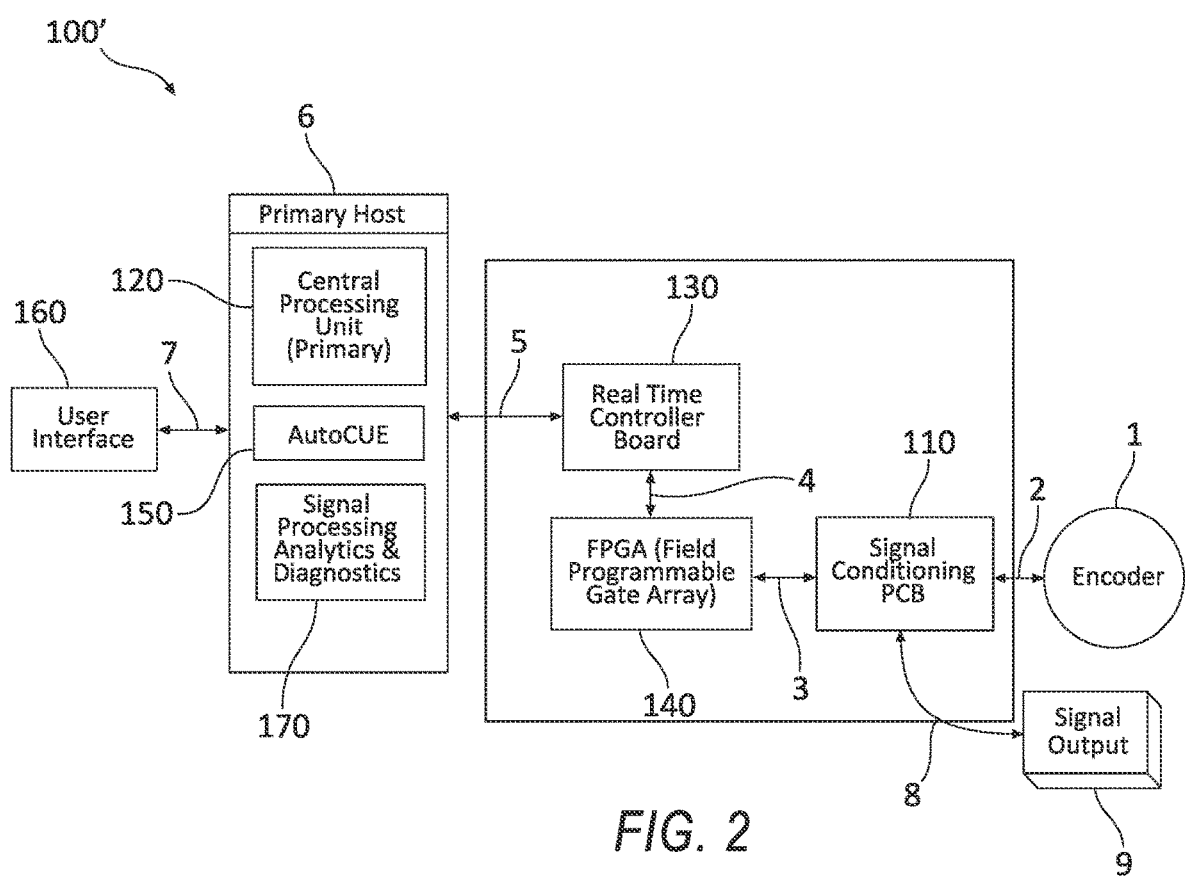
FIG. 2 illustrates a block diagram of a testing apparatus according to another example where the system controller or central processing unit is external to the apparatus.

FIG. 1 shows an example of an embedded host testing apparatus 100, while FIG. 2 shows an example of an external host testing apparatus 100'. In FIG. 2, unlike FIG. 1, the CPU 120 and APP 150 are hosted externally from the testing apparatus 1 on a primary host, and the user interface 160 is connected (e.g., plugged in) to the primary host. The external host testing apparatus 100' may additionally include a signal processing, analytics, and diagnostics mechanism 170. Otherwise, the features and functionality are the same as in FIG. 1.

Figure 3A:
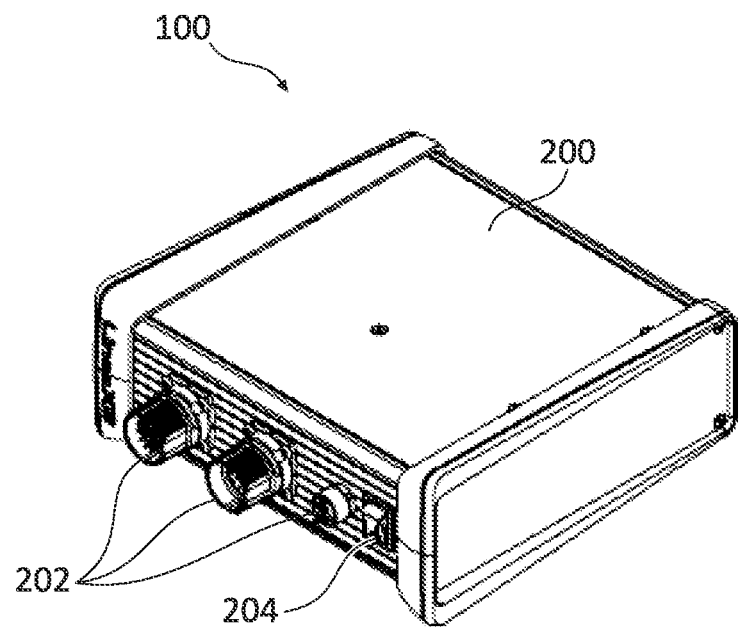
FIGS. 3A and 3B illustrate front and rear perspective views of the testing apparatus according to an example.
Figure 3B:
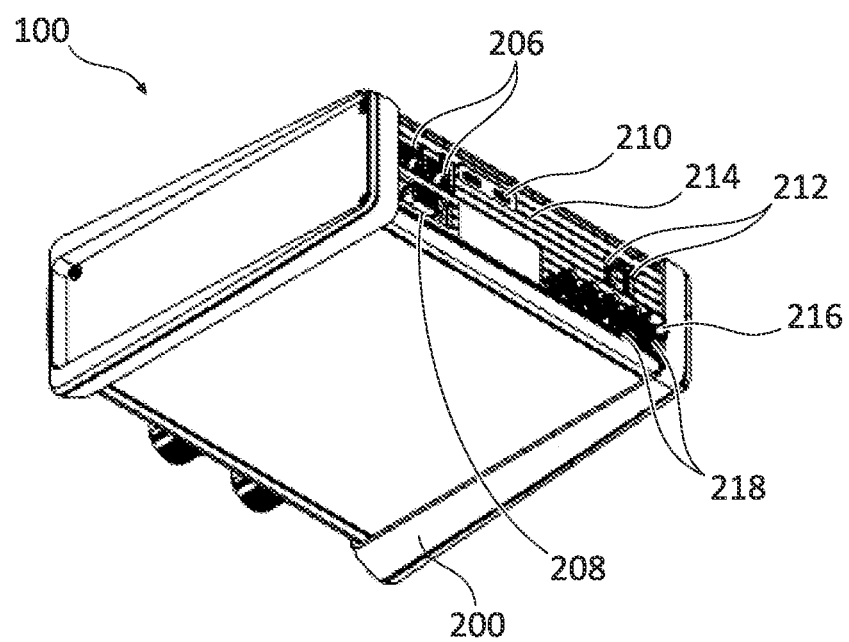

FIGS. 3A and 3B illustrate front and rear perspective views of the testing apparatus 100. The testing apparatus 100 comprises an enclosure 200 with one or a plurality of cable connectors 202 providing the input/output connector 2 operatively coupled to the PCB 110 and a power switch 204 for turning the testing apparatus 100 on and off. The cable connectors 202 and power switch 204 are shown in FIG. 3A to be on the same face (e.g., front face) of the enclosure 200, although it will be appreciated that the cable connectors 202 and the power switch 204 may be provided on different faces of the enclosure 200 without departing from the scope of the disclosure. On the opposite face (e.g., rear face) of the enclosure 200, as shown in FIG. 3B, the testing apparatus 100 comprises at least one, and preferably two, EtherCAT (Ethernet for Control Automation Technology) connections 206, a 15 pin connector 208, at least one USB-C connector 210, one or more (e.g., two) USB-A connectors 212, a reset button 214 to reset or restart the test operation, a power connector 216 for powering the testing apparatus 100, and one or more (e.g., four) scope outputs 218 for outputting feedback sensor signals to other devices such as an oscilloscope for reviewing.

Pursuant to an aspect of the disclosure, the testing apparatus 100 operates as follows:

The APP 150 is stored on the CPU 120 and deployed from the CPU 120 for the configuration and operation of the user interface 160, the real time controller 130, and the CPU 120.

A feedback sensor 1, for example an encoder, is connected to the testing apparatus 100. The testing apparatus 100 is powered up (meaning the power switch is activated plus the power switch(es) of the CPU 120 and the user interface 160 if these are external standalone devices as shown in FIG. 2).

The PCB 110 of the testing apparatus delivers power to the feedback sensor 1.

The operator uses the user interface 160 to activate the APP 150, for example, by clicking on an icon or pressing a button.

The APP 150 then configures the FPGA 140 based on the test, control, monitor or analyze parameters, which are specific to the encoder type selected, input into the user interface 160.

The real time controller 130 acts as a gateway between devices and communication system for the FPGA 140.

The operator then uses the user interface 160 to activate the sensor/encoder testing routine of the testing apparatus by clicking a "Collect Data" button displayed on the user interface 160.

The signals to and/or from the encoder 1 travel through the PCB 110 which prepares them for processing by the FPGA 140, real time controller 130, CPU 120 and APP 150. The real time controller 130 allows processing, analyzing and displaying of encoder values in real-time which provides the most accurate form of signal processing and analytics possible. The APP 150 stores predefined values used for the analytic processes performed by the CPU 120, and the FPGA 140 conditions/formats the signals received from the encoder 1 for use by the CPU 120. Additionally or alternatively, the FPGA 140 may perform analytic processes by checking for signal values and characteristics separately or in tandem with the CPU 120 and compare the signals to predefined values stored in the APP 150.

Values, readings and faults are captured in real-time and displayed to the operator on the user interface 160. The values, readings and faults are also retained in the CPU 120 and the real time controller 130 for report generation. The CPU 120 may assign a value in the form of a percentage that rates the operation and integrity of the tested feedback device 1 as compared to values stored in the APP 150.

Feedback readings which pass the analytic test standards or checks are automatically applied to the current test parameters via artificial intelligence (AI) like functions which continually update these analytic values constantly improving diagnostic and troubleshooting functions. Values and readings considered faulty are displayed on the user interface 160, which also provides/displays corrective actions pertaining to these faults to assist the operator.

Figure 4:
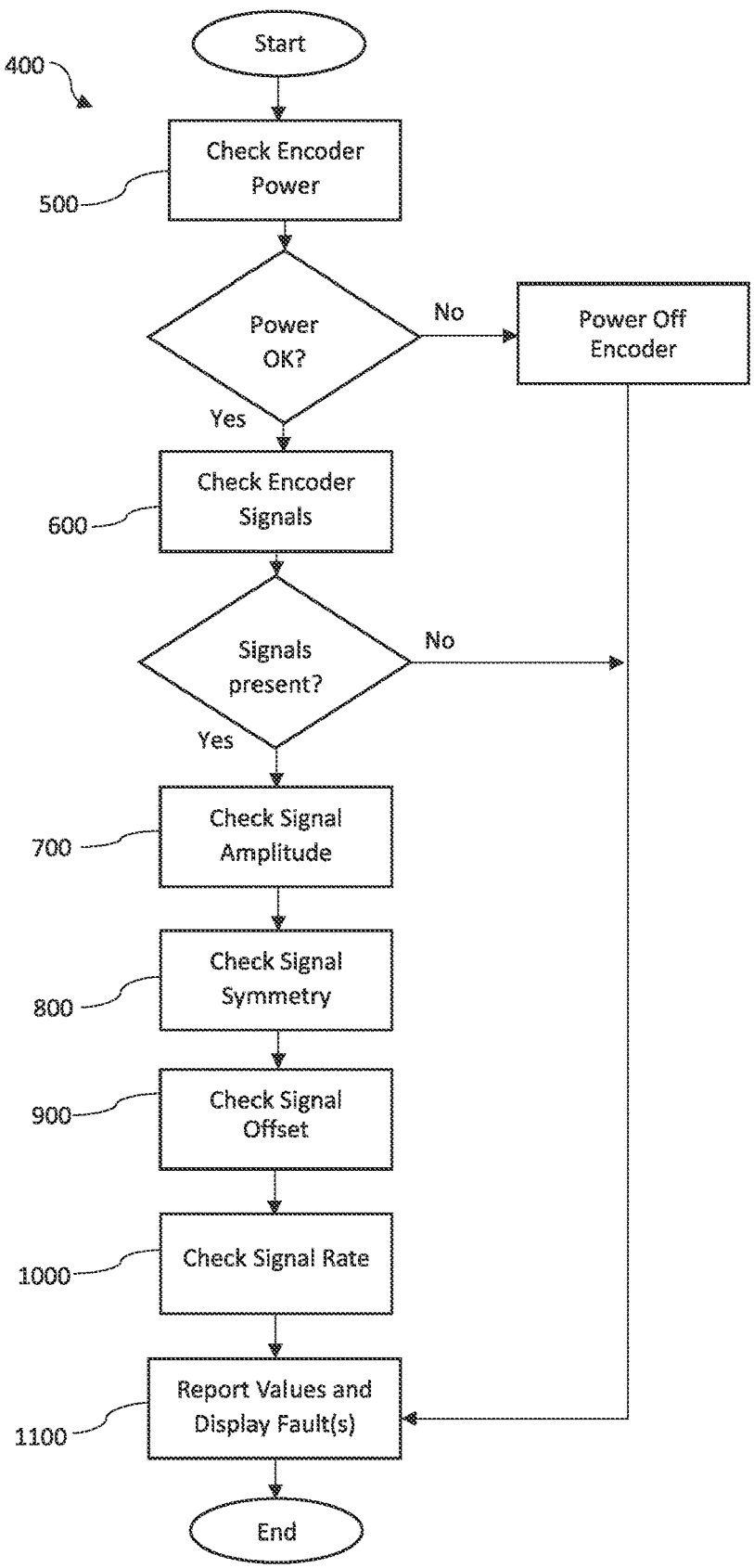
FIG. 4 illustrates a flow chart of a process for testing a feedback device.

FIG. 4 shows a flow chart illustrating an overview of the testing routine or process for testing a feedback device, such as an encoder 1, and FIGS. 7A and 8-10 show flow charts illustrating specific checks 700-1000.

Referring to FIG. 4, the testing routine or process 400 begins with a power check 500 as an initial check to ensure that the encoder is operating within its design power capacity. If the power is abnormal, the encoder is turned off, a report is generated with the fault(s) displayed, and the process ends. If the power check is ok, the process proceeds to step 600.

At step 600, a check for signal process is performed as an optional step to determine if the encoder has a dead channel(s) and/or intermittently dead channel(s). If no signal is present, an error report is generated and the process ends. If the output channel(s) are working correctly, the process proceeds to step 700 for the first of the encoder fault checks.

At step 700, the testing apparatus 100 performs a signal amplitude check by capturing the amplitude of the high state and low state signals and comparing, via the CPU 120, these values to predefined values stored in the APP 150. The results are stored for the fault analysis report and the process 400 moves to step 800.

At step 800, the testing apparatus 100 performs a signal symmetry check by comparing the symmetry of the received signal(s) between the ON TIME and the OFF TIME, and validating that the signals are symmetrical within a threshold of plus or minus (+/−) 2-5%. The results are stored for the fault analysis report and the process 400 moves to step 900.

At step 900, the testing apparatus 100 performs a signal offset check by comparing the duty cycle of the measured signal to the predefined duty cycle for the signal, and then reports whether the phase difference is normal or abnormal. The results are stored for the fault analysis report and the process 400 moves to step 1000.

At step 1000, the testing apparatus 100 performs a signal data rate check by measuring the rate at which the signal is received (e.g., bits per second or cycles per second) and comparing the measured value against a predefined value for the particular encoder under test. The results are stored for the fault analysis report and the process 400 moves to step 1100.

At step 1100, the testing apparatus 100 generates a fault analysis report that is output to the user interface 160, wherein the fault analysis report details the presence of faults per the checks performed at steps 700-1000, and corrective measures to fix the faults. The fault analysis report can be saved in the CPU 120 for record keeping, printing and/or distribution.

It will be appreciated that the steps 700-1000 may be performed in a different order than that shown without departing from the scope of the disclosure. However, the steps 500 and 600 are generally performed before steps 700-1000, since normal power and working output channels are conditions precedent to signal analysis.

Figure 5:
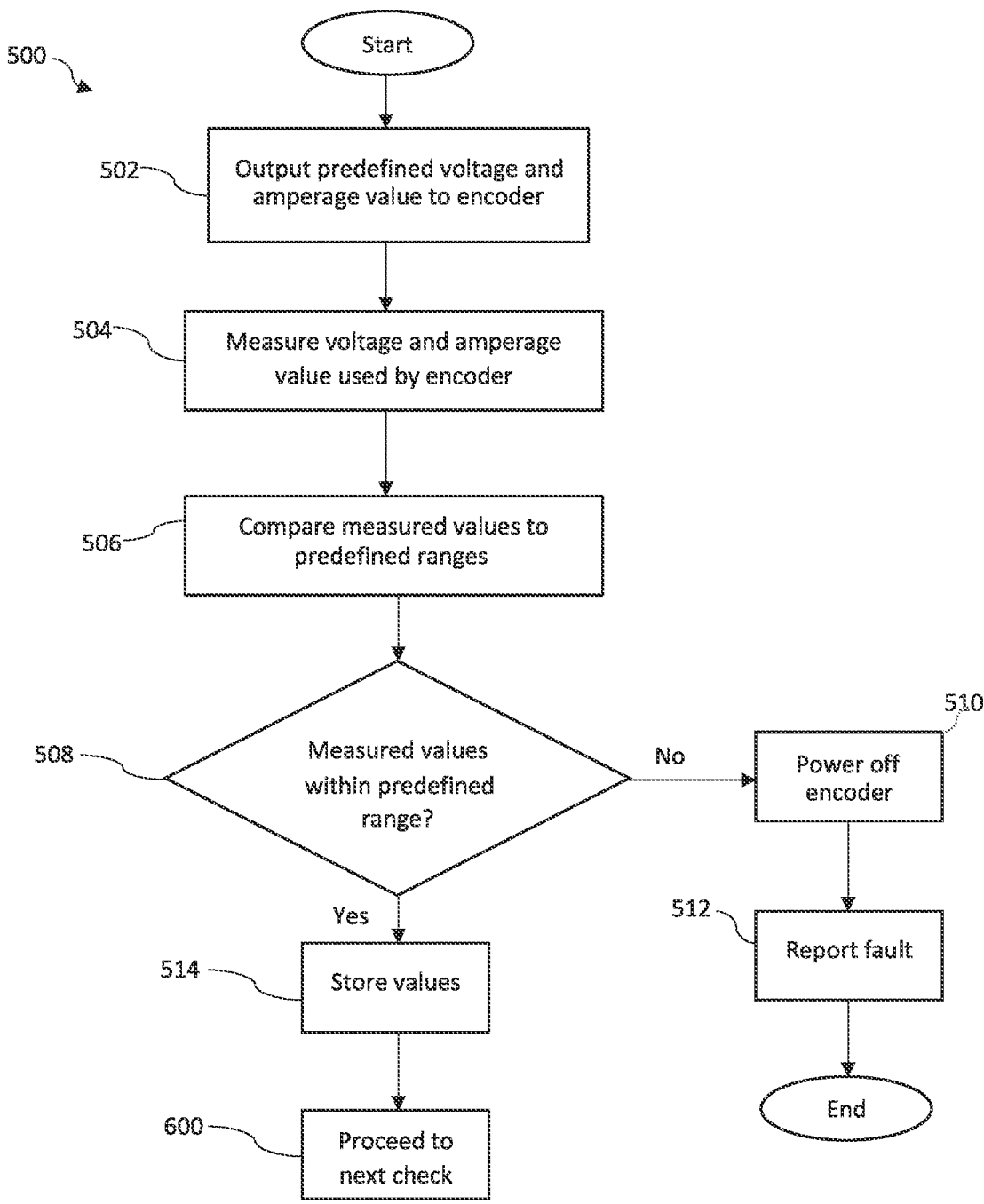
FIG. 5 illustrates a flow chart for a power check according to FIG. 4.

FIG. 5 shows a flow chart for the power check 500 of process 400. The power check 500 is an initial check that the testing apparatus 100 performs on the encoder 1 to ensure that the encoder 1 is operating within its designed power capacity.

At block 502, the testing apparatus 100 delivers the required voltage to the encoder 1, based on encoder specifications from the manufacture which are stored as parameters in the APP 150. Encoders operate at particular voltages and amperages, and the APP 150 has a database of encoders with associated operating voltages and parameters that are accessible to the CPU 120.

At block 504, the testing apparatus 100, e.g., via the CPU 120, measures the voltage and amperage being used by the encoder.

At block 506, the CPU 120 compares the measured values to predefined values stored in the APP 150, and determines if the encoder is operating as designed or if there are variances in the voltage level and/or the amperage level at block 508. If the measured values are outside of the predefined range, the encoder is powered off at block 510, and then the measurements are reported to the user at block 512 along with a fault indication of abnormal power and low or high voltage and/or amperage usage and the process 400 ends. If the measured values are within a predefined range, the measurements are reported to the user along with a message on the user interface 160 indicating normal power consumption at block 514 and then the process proceeds to the next check 600.

Figure 6:
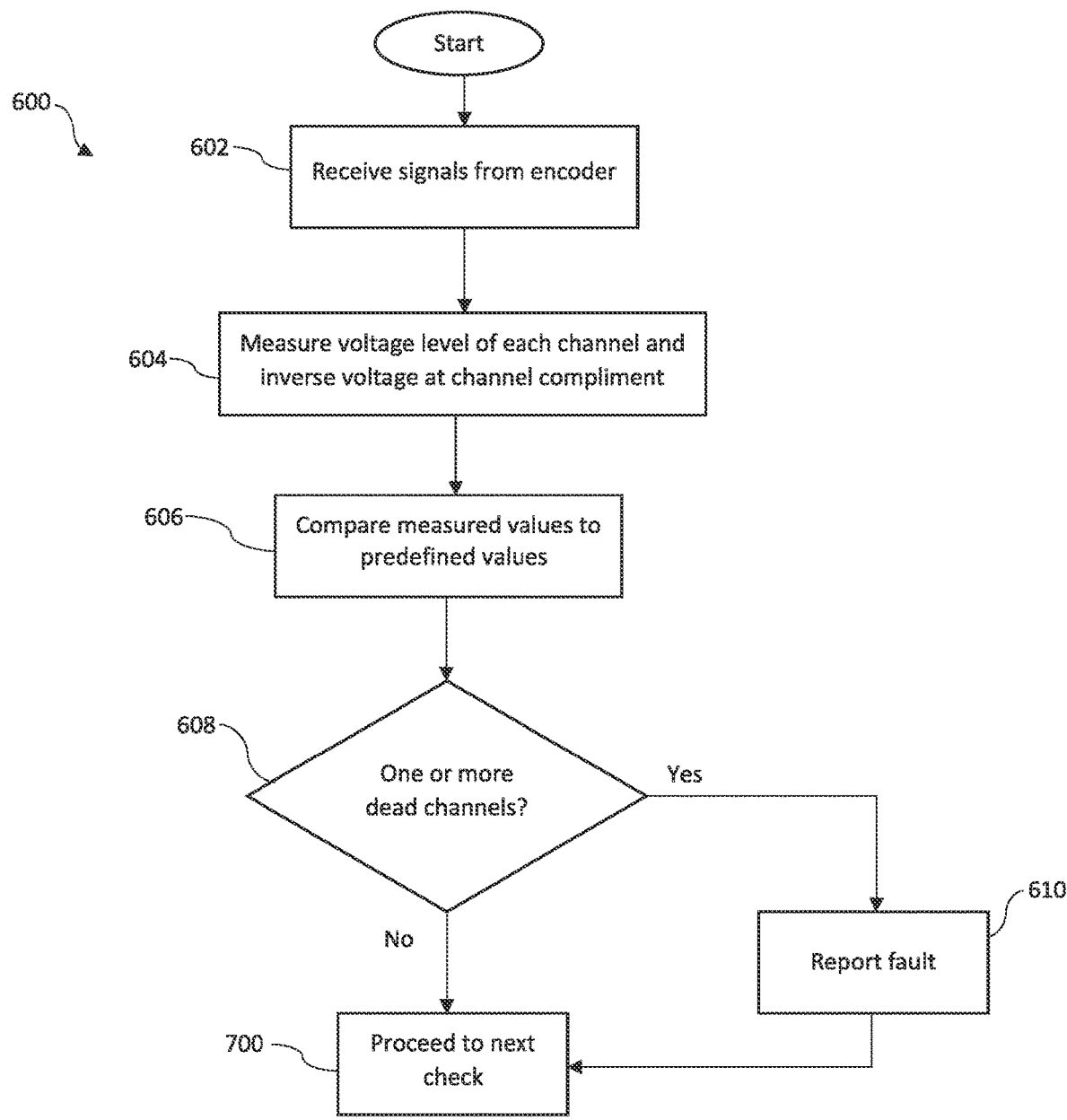
FIG. 6 illustrates a flow chart for a signal channel check according to FIG. 4.

FIG. 6 shows a flow chart for a check for encoder signal(s) 600. The check for encoder signal(s) 600 is a standard check that testing apparatus 100 performs on all encoders and may be optional in some implementations. Encoders have anywhere from 2 to 12 output channels that carry digital or analog signals. This check 600 determines whether the encoder has a dead channel(s) and/or intermittently dead channel(s).

At block 602, encoder signals are received at the PCB 110 which prepares them for processing by the FPGA 140, real time controller 130, CPU 120 and APP 150. The FPGA 140 then conditions/formats the signal(s), which is/are sent to the real time controller 130, which allows processing, analyzing and displaying of the values in real-time. The real time controller 130 buffers and transfers the signals to the CPU 120 for process.

At block 604, the CPU 120 then uses the values to measure the voltage level at each channel and the inverse voltage level at the complimentary channel.

At block 606, the CPU 120 compares the measured voltage at each channel and inverse voltage level at the complementary channel with the predefined value stored in the APP 150, to determine if the signal set is correct at block 608. For example, Table 1 below shows a simplified version of a check for signal sets A and A*, B and B*, and so on, where the cells shaded with diagonal lines indicate instances where the signal sets were faulty.

TABLE 1

| | A | A* | B | B* | Z | Z* | U | U* | V | V* | W | W* | Dat | Dat* |
|---|---|---|---|---|---|---|---|---|---|---|---|---|---|---|
| 1 | H | L | H | L | H | L | H | L | H | L | H | L | H | L |
| 2 | H | H | H | L | H | L | L | L | H | L | H | L | H | L |
| 3 | L | H | H | L | L | L | L | H | L | H | H | L | H | H |

At block 610, the testing apparatus 100 displays a report indicating that the signal channel check was ok (e.g., for example 1), or that there was a fault (e.g., for examples 2 and 3) and identifies the dead and/or intermittently dead channel(s), and then the process proceeds to the next check 700.

Figure 7A:
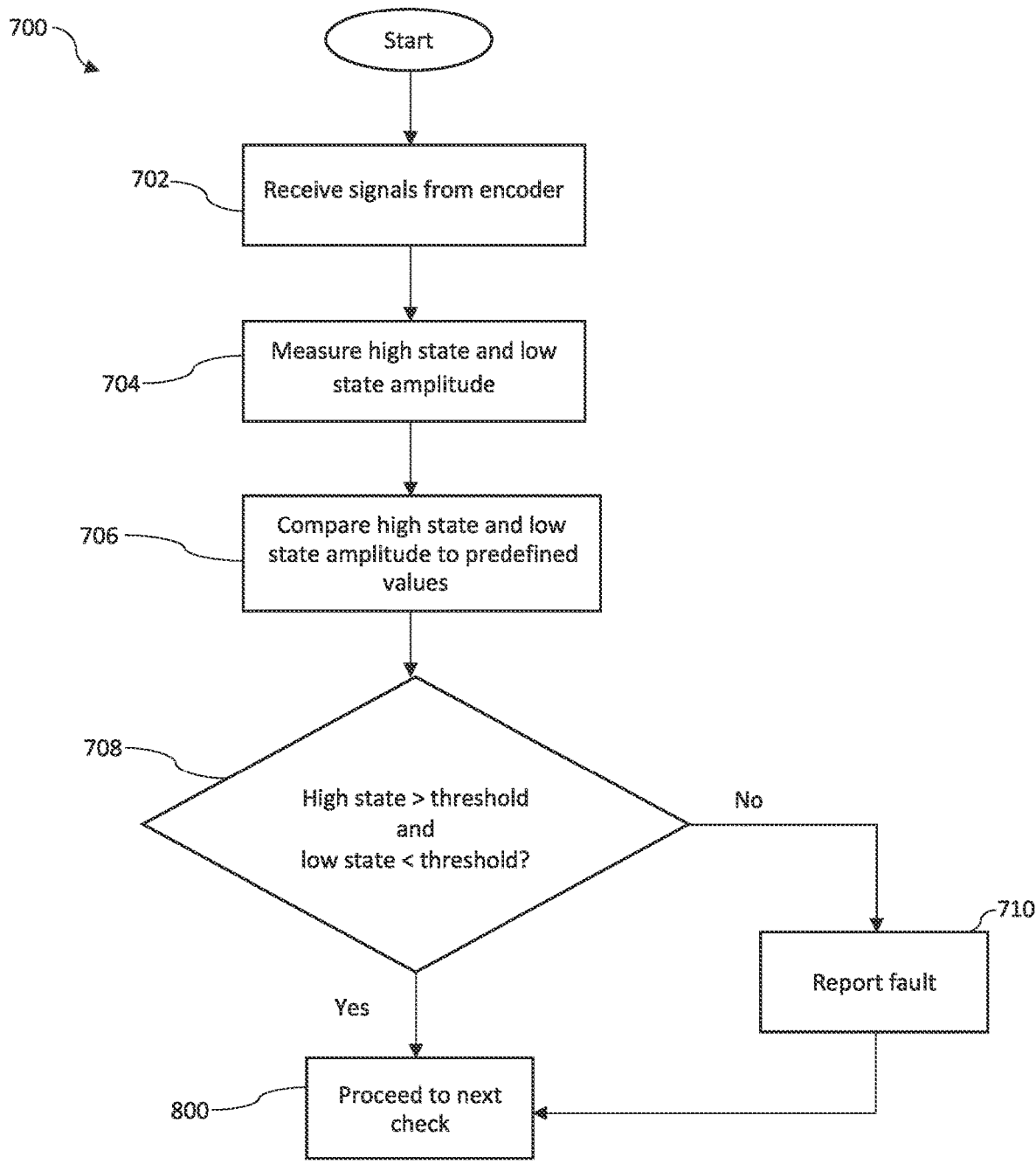
FIG. 7A illustrates a flow chart for a signal amplitude check according to FIG. 4.

FIG. 7A shows a flow chart for a signal amplitude (e.g., height) check 700. This check analyzes the high state amplitude and the low state amplitude of the signal(s) received from the encoder 1. Digital signals operate between 0 volts and 5 volts. A logic state of 1 is the high state and is valid when the voltage level of the signal is greater than 2 volts. A logic state of 0 is the low state and is valid when the voltage level is less than 0.8 volts. Conversely, analog signals operate between positive voltage levels and negative voltage levels, and are not co-defined by logic states. According to non-limiting examples, analog signals may operate between −12 volts and +12 volts, −15 volts and +15 volts, 0 to 24 volts, or 0 to 30 volts. The high state is valid when the voltage level of the signal is greater than 0 volts. The low state is valid when the voltage level is 0 or less than 0 volts. The testing apparatus 100 uses parameters stored in the APP 150 that are specific to the encoder 1 under test, to determine the type of signal (e.g., digital or analog) and predefined ranges for high state and low state signals.

At block 702, encoder signals are received at the PCB 110, which conditions and routes the signals to the FPGA 140. The FPGA 140 then captures the signals as defined by the APP 150, and outputs the signals to the real time controller 130. The real time controller 130 buffers and transfers the signals to the CPU 120 for processing.

At block 704, the CPU 120 measures the high state amplitude and the low state amplitude of the signal. As explained above, the high and low state amplitude will vary depending on the signal type (e.g., analog or digital) and encoder type (e.g., some encoders use analog signals operating at −12 to +12 volts, while other encoders use analog signals operating at −15 volts to +15 volts).

Figure 7B:
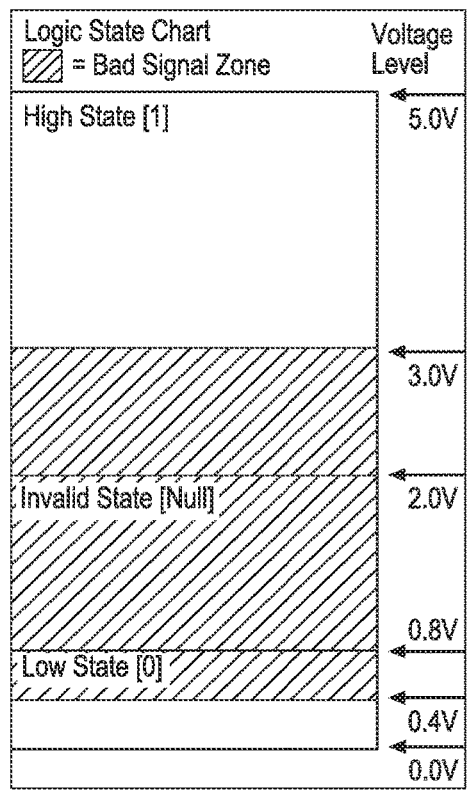
FIGS. 7B and 7C illustrate a digital signal logic state chart and an analog state chart, respectively, according to FIG. 7A.
Figure 7C:
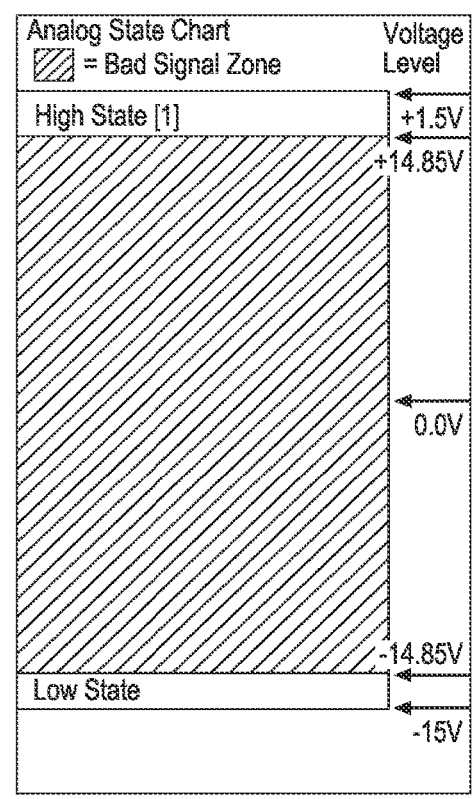

At block 706, the CPU 120 compares the measured values for the high state amplitude and the low state amplitude, respectively, to a corresponding predefined range stored in the APP 150, and determines if the high state and low state fall outside of the predefined ranges at block 708. For digital signals, the predefined range for high state signal amplitude is 3-5 volts, and the predefined range for low state signal amplitude is 0-0.4 volts. If the amplitude of the signal falls between 0.4 volts and 3.0 volts, the signal is determined to be bad and thus faulty. This is shown in FIG. 7B, where the hatching or diagonal lines represent the bad signal zone of 0.4 to 3.0 volts. For analog signals, the predefined range for high state and low state amplitude is dependent on the encoder type under test. Since analog signals are typically used in highly precise applications that require higher tolerance ranges than digital signals, a tolerance of, e.g., 0.5% to 3%, preferably 1.0%, is applied to analog signals. If the amplitude of the signal falls outside of the high state and low state values determined by the 1.0% tolerance according to an illustrative approach, then the signal is deemed bad and thus faulty. An example of this is illustrated in FIG. 7C, where an analog signal operating in a range of −15 volts to +15 volts is shown. Here, the predefined range for the high state amplitude is +14.85 to +15 volts, and the predefined range for the low state amplitude is −14.85 to −15 volts. The hatching or diagonal lines through the range of +14.85 to −14.85 volts represents the bad signal zone, which would trigger a fault notification.

If the CPU 120 determines that the amplitude of the signal falls outside of the predefined high state and low state ranges, then a fault is reported and the process proceeds to the next check 800. On the other hand, if the CPU 120 determines that the amplitude falls within the predefined range for the high state and the low state, then the results may be recorded for display and the process proceeds to the next check 800.

Figure 8:
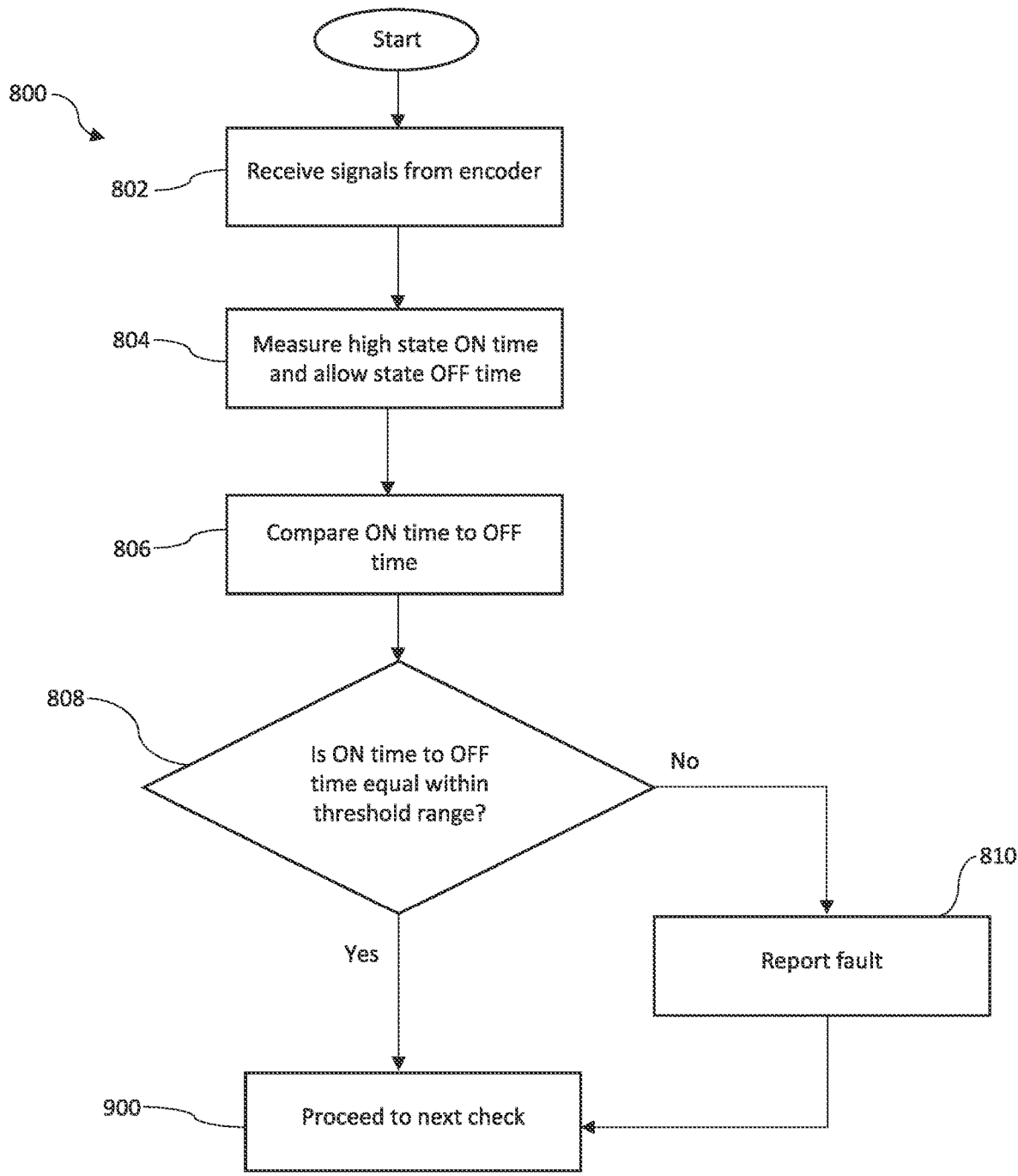
FIG. 8 illustrates a flow chart for a signal symmetry check according to FIG. 4.

FIG. 8 shows a flow chart for a signal symmetry check 800. This checks the symmetry of analog and digital signals by making continual comparisons of two values in the encoder signal, the ON time and the OFF time. The term used to identify the comparison of the ON time and the OFF time is duty cycle.

At block 802, the encoder signals are received at the PCB 110. These signals may be the same signals as used for the signal amplitude check 700, and may pass through the FPGA 140, real time controller 130 and to the CPU 120 as discussed above.

At block 804, the CPU 120 measures the high state ON time duration and the low state OFF time duration of the signals. The ON time and the OFF time are measured and displayed as a percentage value.

At block 806, the CPU 120 compares the ON time and the OFF time of the signals, and determines if the ON time and the OFF time are equal within a threshold or tolerance of +/−1% to 10%, preferably 2-5%, more preferably 3% (e.g., ON time to OFF time of 50%+/−3%, or a value between 47% and 53% according to an illustrative approach where the tolerance is 3%), at block 808. The CPU 120 may make continual comparisons of the ON time and the OFF time to validate the duty cycle. The encoder signal is symmetrical with then ON time and the OFF time are equal (+/−2-5%). If the encoder signal is asymmetrical, that is, the difference between the ON time and the OFF time is more than 2-5% (e.g., the ON time to OFF time is lower than 47% or greater than 53%), then a fault is reported at block 810 and the process proceeds to the next check 900.

Figure 9:
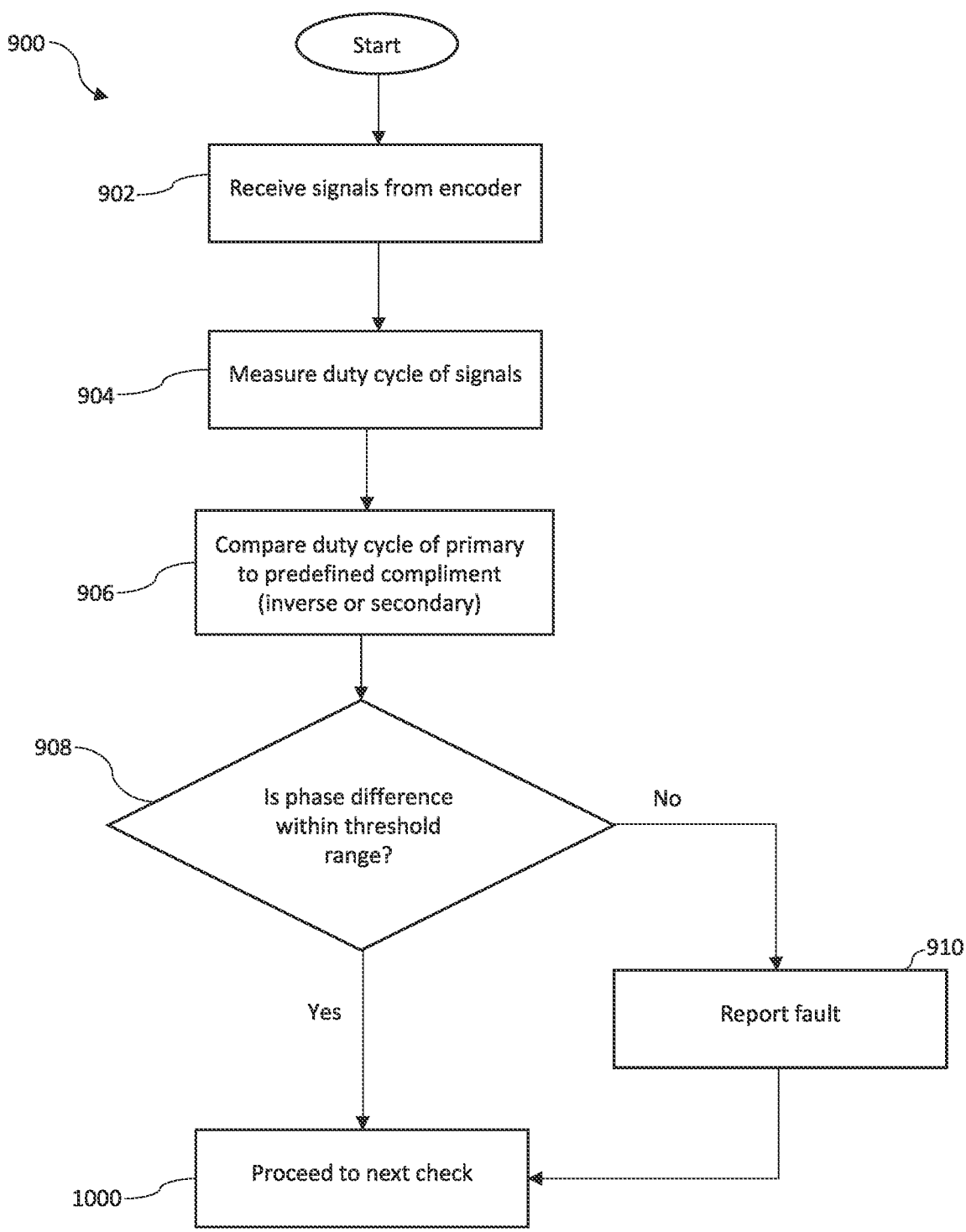
FIG. 9 illustrates a flow chart for a signal offset check according to FIG. 4.

FIG. 9 shows a flow chart for a signal offset check 900. This checks the offset of the encoder signal by comparing the duty cycle of one signal to the duty cycle of another.

At block 902, the encoder signals are received at the PCB 110. These signals may be the same signals as used for the signal amplitude check 700 and the signal symmetry check 800, and may pass through the FPGA 140, real time controller 130 and to the CPU 120 as discussed above.

At block 904, the CPU 120 measures the duty cycle of signal sets under test. The combination of signals in a signal set, e.g., A, A* or B, B* or A, B, are dependent upon the encoder type and stored in the APP 150. When the operator selects the encoder type via the user interface 160, the APP 150 populates the user interface 160 with buttons supporting the testable combinations.

At block 906, the CPU 120 compares the duty cycle of signals in a signal set, and determines if the phase difference is within a predefined threshold of e.g., 1° to 10°, preferably 3°-5°, more preferably 3°, at block 908. Signal sets that are made up of a primary signal and its inverse will have a phase difference of 180°+/−3°-5°, for normal operation. Some signal sets with this characteristic are A, A* or B, B* or Data, Data*. According to an example where the threshold is +/−3°, a faulty signal will have a value below 177° or greater than 183°. Signal sets that are made up of a primary signal and a secondary signal will have a phase difference of 90°+/−3°-5°. Some signal sets with this characteristic are A, B or B*, A* or A*, B*. If the phase difference for the signal set A, B for example is between 87° and 93° (pursuant to an illustrative approach where the threshold is +/−3°), then the signal offset is normal and the process proceeds to the next check 1000. If, on the other hand, the phase difference for the signal set under 87° or greater than 93°, then a fault is reported at block 910 and the process proceeds to the next check 1000.

Figure 10:
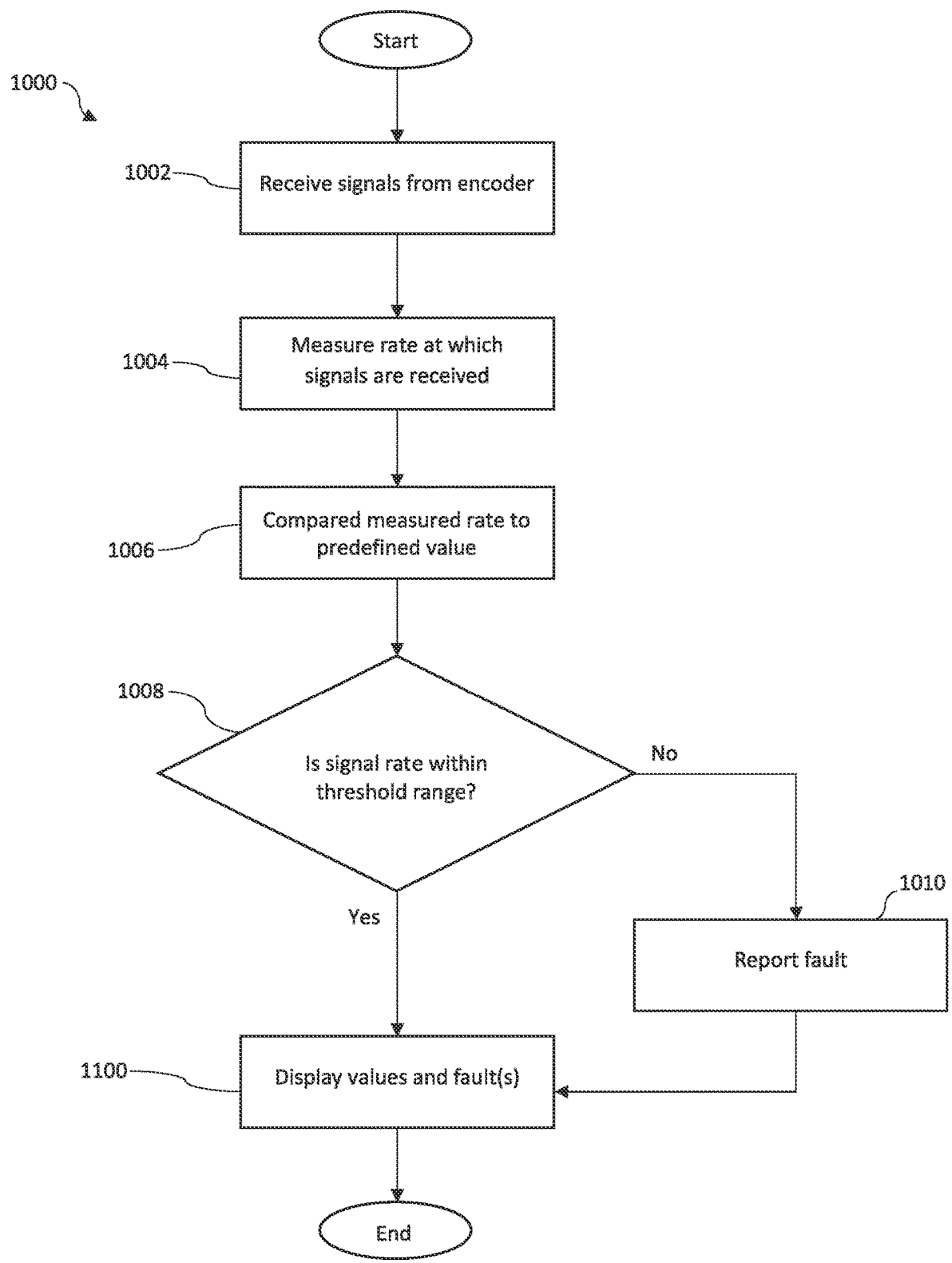
FIG. 10 illustrates a flow chart for a signal rate check according to FIG. 4.

FIG. 10 shows a flow chart for a signal data rate check 1000. This checks the rate at which the signals are received from the encoder 1 under test.

At block 1002, the encoder signals are received at the PCB 110. These signals may be the same signals as used for the signal amplitude check 700, the signal symmetry check 800, and the signal offset check 900, and may pass through the FPGA 140, real time controller 130 and to the CPU 120 as discussed above.

At block 1004, the CPU 120 measures the rate at which the signals are received or respectively the signal rate transmission from the encoder 1. Analog and digital signals are calculated in cycles per second, while data signals are calculated in bits per second.

At block 1006, the CPU 120 compares the signal rate to predefined values based on manufacture specifications stored in the APP 150, and determines if the signal rate is equal to or within a permissible threshold, e.g., +/−3% to 15%, preferably 5%-10%, more preferably 7%, of the predefined value at block 1008. If the signal rate falls outside of the predefined value +/−5%-10%, for example, then a fault is reported at block 1010 and the process proceeds to the next step 1100.

At block 1100, the CPU 120 transmits values and readings considered faulty that were stored in steps 510, 610, 710, 810, 910, and 1010 to be displayed on the user interface 160. The fault notification may include a message, such as a phrase, indicating the type of fault (e.g., asymmetry detected, faulty amplitude) and may suggest corrective action. Then the process ends.

In the processes 500, 600, 700, 800, 900, 1000 described above, the FPGA 140 may be configured to check for signal values and/or characteristics separately or in tandem with the CPU 120, and compare the signals to a predefined threshold or value stored in a database, e.g., in the APP 150.

It will be appreciated that the testing apparatus 100 processes the inputted signals in real-time and then displays on the user interface 160 at least one of signal representations, positional data, angular data, directional, data, and speed data depending on the feedback type connected. Additionally, the diagnostics and troubleshooting analytics are performed in real-time on the signals received from the feedback device, and the results thereof are displayed on the user interface 160 as fault indicators and text.

According to an aspect, there is provided a testing apparatus 100 for feedback devices comprising: a signal conditioning circuit board 110 that receives a feedback signal; and a central processing unit 120 in communication with the signal condition circuit board 110. The central processing unit 120 is configured to perform a power check by measuring a voltage and an amperage of the feedback signal, and comparing the measured voltage and the measured amperage to a predefined voltage range and a predefined amperage range, respectively.

Pursuant to an implementation, the central processing unit 120 is configured to communicate a power off command in response to determining that at least one of the measured voltage and the measured amperage is outside of the predefined voltage range and the predefined amperage range, respectively.

Pursuant to another implementation, the central processing unit 120 is further configured to check for faulty amplitude by measuring a high state amplitude and a low state amplitude of the feedback signal, and comparing the high state signal amplitude and the low state signal amplitude to a predefined amplitude range.

Additionally or alternatively, the central processing unit 120 is further configured to check for signal symmetry by measuring a duty cycle of the feedback signal, and comparing an ON time and an OFF time of the signal to determine if a ratio of the ON time to the OFF time falls within a predefined symmetry threshold.

Additionally or alternatively, the central processing unit 120 is further configured to check for signal offset by comparing a phase angle of the feedback signal with that of a complementary signal, and determine if a phase difference of the signals falls within a predefined offset threshold.

Additionally or alternatively, the central processing unit 120 is further configured to check for signal transmission rate by measuring a rate at which the feedback signal is received, and comparing the measured rate to a predefined rate threshold.

The testing apparatus 100 may include a field programmable gate array 140 and a real-time controller 130. The real-time controller transfers the feedback signal and data between the central processing unit 120 and the field programmable gate array 140.

According to another aspect, there is provided a testing apparatus 100 for encoders comprising: a signal conditioning circuit board 110 that receives an encoder signal; and a central processing unit 120 in communication with the signal condition circuit board 110. The central processing unit 120 is configured to: check for faulty amplitude by measuring a high state amplitude and a low state amplitude of the encoder signal, and comparing the high state signal amplitude and the low state signal amplitude to a predefined amplitude range; check for signal symmetry by measuring a duty cycle of the encoder signal, and comparing an ON time and an OFF time of the signal to determine if a ratio of the ON time to the OFF time falls within a predefined symmetry threshold; check for signal offset by comparing a phase angle of the encoder signal with that of a complementary signal, and determine if a phase difference of the signals falls within a predefined offset threshold; and check for signal transmission rate by measuring a rate at which the encoder signal is received, and comparing the measured rate to a predefined rate threshold.

Pursuant to an implementation, the testing apparatus 100 includes a user interface 160 in communication with the central processing unit 120, the central processing unit 120 configured to report a fault to the user interface if at least one of: the high state signal amplitude and the low state signal amplitude is outside the predefined amplitude range; the ratio of the ON time to the OFF time falls outside of the predefined symmetry threshold; the phase difference falls outside of the predefined offset threshold; and the rate at which the encoder signal is received falls outside the predefined rate threshold.

Pursuant to another implementation, the central processing unit 120 is further configured to perform a power check by measuring a voltage and an amperage of the encoder signal, and comparing the measured voltage and the measured amperage to a predefined voltage range and a predefined amperage range, respectively. The central processing unit 120 may be configured to communicate a power off command in response to determining that at least one of the measured voltage and the measured amperage is outside of the predefined voltage range and the predefined amperage range, respectively.

The testing apparatus 100 may include a field programmable gate array 140 that captures the encoder signal from the signal conditioning circuit board 110, and formats the signals for the central processing unit 120. A real-time controller 130 may transfer the encoder signals and data between the central processing unit 120 and the field programmable gate array 140.

Pursuant to yet another aspect, there is provided a method for testing an encoder comprising: checking for faulty amplitude by measuring a high state amplitude and a low state amplitude of an encoder signal, and comparing the high state signal amplitude and the low state signal amplitude to a predefined amplitude range; checking for signal symmetry by measuring a duty cycle of the encoder signal, and comparing an ON time and an OFF time of the signal to determine if a ratio of the ON time to the OFF time falls within a predefined symmetry threshold; checking for signal offset by comparing a phase angle of the encoder signal with that of a complementary signal, and determine if a phase difference of the signals falls within a predefined offset threshold; and checking for signal transmission rate by measuring a rate at which the encoder signal is received, and comparing the measured rate to a predefined rate threshold.

Pursuant to an implementation, the method further includes outputting a fault to a user interface in response to at least one of: the high state signal amplitude and the low state signal amplitude is outside the predefined amplitude range; the ratio of the ON time to the OFF time falls outside of the predefined symmetry threshold; the phase difference falls outside of the predefined offset threshold; and the rate at which the encoder signal falls outside the predefined rate threshold.

Pursuant to another implementation, the method further includes performing a power check by measuring a voltage and an amperage of the encoder signal, and comparing the measured voltage and the measured amperage to a predefined voltage range and a predefined amperage range, respectively. The method may additionally include communicating an encoder power off command in response to determining that at least one of the measured voltage and the measured amperage is outside of the predefined voltage range and the predefined amperage range, respectively.

It will be appreciated that the aforementioned apparatus and method(s) may be modified to have some components and steps removed, or may have additional components and steps added, all of which are deemed to be within the spirit of the present disclosure. Accordingly, even though the present disclosure has been described in detail with reference to specific examples, it will be appreciated that the various modifications and changes can be made to these examples without departing from the scope of the present disclosure as set forth in the claims. It is anticipated and intended that future developments will occur in the technologies discussed herein, and that the disclosed method, device and/or article will be incorporated into such future developments. Thus, the specification and the drawings are to be regarded as an illustrative thought instead of merely restrictive thought.

It should be understood that the CPU 120 as described herein may include a conventional processing apparatus known in the art, which may be capable of executing preprogrammed instructions stored in an associated memory, all performing in accordance with the functionality described herein. The CPU 120 may be configured to perform various functions, including those described in greater detail herein, with appropriate programming instructions and/or code embodied in software, hardware, and/or other medium. To the extent that the methods described herein are embodied in software, the resulting software can be stored in an associated memory and can also constitute means for performing such methods. Such a system or processor may further be of the type having ROM, RAM, and/or a combination of non-volatile and volatile memory so that any software may be stored and yet allow storage and processing of dynamically produced data and/or signals.

The CPU 120 may include a memory with the APP 150 stored on the memory. Computing systems generally include computer-executable instructions, where the instructions may define operations and may be executable by one or more devices such as those listed herein. Computer-executable instructions may be compiled or interpreted from computer programs created using a variety of programming languages and/or technologies, including, without limitation, and either alone or in combination, Java language, C, C++, LabVIEW G, Python, VHDL, Visual Basic, Java Script, Perl, SQL, PL/SQL, Shell Scripts, Unity language, etc.

In general, computing system including CPU 120 may employ any of a number of computer operating systems, including, but by no means limited to, versions and/or varieties of the Microsoft Windows® operating system, the Unix operating system (e.g., the Solaris® operating system distributed by Oracle Corporation of Redwood Shores, California), the AIX UNIX operating system distributed by International Business Machines of Armonk, New York, the Linux operating system, the Mac OS X and iOS operating systems distributed by Apple Inc. of Cupertino, California, the BlackBerry OS distributed by Research In Motion of Waterloo, Canada, and the Android operating system developed by the Open Handset Alliance.

A memory may include, in general, any computer-readable medium (also referred to as a processor-readable medium) that may include any non-transitory (e.g., tangible) medium that provides instructions that may be read by a computer (e.g., by CPU 120). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including radio waves, metal wire, fiber optics, and the like, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Further, databases, data repositories or other information stores (e.g., APP 150) described herein may generally include various kinds of mechanisms for storing, providing, accessing, and retrieving various kinds of information, including a hierarchical database, a set of files in a file system, an application database in a proprietary format, a relational database management system (RDBMS), etc. Each such information may generally be included within (e.g., memory) or external to a computing system and/or device (e.g., CPU 120) employing a computer operating system such as one of those mentioned above, and/or accessed via a network or connection in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary. Further, the use of "at least one of" is intended to be inclusive, analogous to the term and/or. Additionally, use of adjectives such as first, second, etc. should be read to be interchangeable unless a claim recites an explicit limitation to the contrary.

The invention claimed is:

1. A testing apparatus for feedback devices, comprising:
a signal conditioning circuit board that receives a feedback signal;
a central processing unit in communication with the signal conditioning circuit board, the central processing unit configured to:
perform a power check by measuring a voltage and an amperage of the feedback signal, and comparing the measured voltage and the measured amperage to a predefined voltage range and a predefined amperage range, respectively;
check for faulty amplitude by measuring both a high state amplitude and a low state amplitude of the feedback signal, and comparing the high state signal amplitude and the low state signal amplitude to a corresponding predefined amplitude range; and
check for signal symmetry by measuring a duty cycle of the feedback signal, and continually comparing an ON time and an OFF time of the signal to determine if a ratio of the ON time to the OFF time falls within a predefined symmetry threshold.

2. The testing apparatus of claim 1, wherein the central processing unit is configured to communicate a power off command in response to determining that at least one of the measured voltage and the measured amperage is outside of the predefined voltage range and the predefined amperage range, respectively.

3. The testing apparatus of claim 1, wherein the central processing unit is further configured to check for signal offset by comparing a phase angle of the feedback signal with that of a complementary signal, and determine if a phase difference of the signals falls within a predefined offset threshold.

4. The testing apparatus of claim 1, wherein the central processing unit is further configured to check for signal transmission rate by measuring a rate at which the feedback signal is received, and comparing the measured rate to a predefined rate threshold.

5. The testing apparatus of claim 1, further comprising a field programmable gate array that captures the feedback signal from the signal conditioning circuit board, and formats the feedback signal for the central processing unit.

6. The testing apparatus of claim 5, wherein the field programmable gate array is configured to check for at least one of values and characteristics of the feedback signal separately or in tandem with the central processing unit and compare the at least one of values and characteristics to a predefined threshold.

7. A testing apparatus for encoders, comprising:
a signal conditioning circuit board that receives an encoder signal; and
a central processing unit in communication with the signal condition circuit board, the central processing unit configured to:
check for faulty amplitude by measuring a high state amplitude and a low state amplitude of the encoder signal, and comparing the high state signal amplitude and the low state signal amplitude to a predefined amplitude range;
check for signal symmetry by measuring a duty cycle of the encoder signal, and continually comparing an ON time and an OFF time of the signal to determine if a ratio of the ON time to the OFF time falls within a predefined symmetry threshold;
check for signal offset by comparing a phase angle of the encoder signal with that of a complementary signal, and determine if a phase difference of the signals falls within a predefined offset threshold; and
check for signal transmission rate by measuring a rate at which the encoder signal is received, and comparing the measured rate to a predefined rate threshold.

8. The testing apparatus of claim 7, further comprising a user interface in communication with the central processing unit, wherein the central processing unit is configured to report a fault to the user interface if at least one of:
the high state signal amplitude and the low state signal amplitude is outside the predefined amplitude range;
the ratio of the ON time to the OFF time falls outside of the predefined symmetry threshold;

the phase difference falls outside of the predefined offset threshold; and the rate at which the encoder signal is received falls outside the predefined rate threshold.

9. The testing apparatus of claim 7, further comprising a field programmable gate array that captures the encoder signal from the signal conditioning circuit board, and formats the signals for the central processing unit.

10. The testing apparatus of claim 9, further comprising a real-time controller that transfers the encoder signals and data between the central processing unit and the field programmable gate array.

11. The testing apparatus of claim 7, further comprising an enclosure with an input/output connector operatively coupled to the signal conditioning circuit board.

12. The testing apparatus of claim 7, wherein the encoder signal includes at least one of:
   analog signals ranging between −10 and +10 volts;
   analog signals ranging between 0 and 200 milliamperes;
   digital TTL signals ranging between 0 and 5 volts;
   serial signals ranging between 0 and 5 volts; and
   RMS signals ranging between −1000 and +1000 volts.

13. The testing apparatus of claim 7, wherein the central processing unit is further configured to perform a power check by measuring a voltage and an amperage of the encoder signal, and comparing the measured voltage and the measured amperage to a predefined voltage range and a predefined amperage range, respectively.

14. The testing apparatus of claim 7, wherein the check for faulty amplitude includes measuring both the high state amplitude and the low state amplitude of the encoder signal, and comparing the high state amplitude and the low state amplitude to a corresponding predefined amplitude range.

15. A method for testing an encoder, comprising:
   checking for faulty amplitude by measuring both a high state amplitude and a low state amplitude of an encoder signal, and comparing the high state signal amplitude and the low state signal amplitude to a corresponding predefined amplitude range;
   checking for signal symmetry by measuring a duty cycle of the encoder signal, and comparing an ON time and an OFF time of the signal to determine if a ratio of the ON time to the OFF time falls within a predefined symmetry threshold;
   checking for signal offset by comparing a phase angle of the encoder signal with that of a complementary signal, and determine if a phase difference of the signals falls within a predefined offset threshold; and
   checking for signal transmission rate by measuring a rate at which the encoder signal is received, and comparing the measured rate to a predefined rate threshold;
   wherein comparing the ON time and the OFF time of the signal includes continually comparing the ON time and the OFF time of the signal to determine if the ratio of the ON time to the OFF time falls within the predefined symmetry threshold.

16. The method of claim 15, further comprising outputting a fault to a user interface in response to at least one of:
   the high state signal amplitude and the low state signal amplitude is outside the predefined amplitude range;
   the ratio of the ON time to the OFF time falls outside of the predefined symmetry threshold;
   the phase difference falls outside of the predefined offset threshold; and
   the rate at which the encoder signal falls outside the predefined rate threshold.

17. The method of claim 15, further comprising performing a power check by measuring a voltage and an amperage of the encoder signal, and comparing the measured voltage and the measured amperage to a predefined voltage range and a predefined amperage range, respectively.

18. The method of claim 17, further comprising communicating an encoder power off command in response to determining that at least one of the measured voltage and the measured amperage is outside of the predefined voltage range and the predefined amperage range, respectively.

* * * * *